United States Patent [19]

Shu et al.

[11] Patent Number: 5,519,712
[45] Date of Patent: May 21, 1996

[54] CURRENT MODE TEST CIRCUIT FOR SRAM

[75] Inventors: Lee-Lean Shu, Cupertino; Kurt Knorpp, Redwood City, both of Calif.; Katsunori Seno, Atsugi, Japan

[73] Assignee: Sony Electronics, Inc., Park Ridge, N.J.

[21] Appl. No.: 323,053

[22] Filed: Oct. 12, 1994

Related U.S. Application Data

[63] Continuation of Ser. No. 942,719, Sep. 9, 1992, abandoned.

[51] Int. Cl.[6] ............................................. G11C 29/00
[52] U.S. Cl. .................. 365/201; 371/22.5; 371/22.6; 371/40.4; 365/202
[58] Field of Search ............... 371/21.4, 21.1–21.3, 371/21.6, 22.5, 22.6, 23, 24, 25.1, 26, 40.1, 40.4; 365/201, 202, 208

[56] References Cited

U.S. PATENT DOCUMENTS

| | | | |
|---|---|---|---|
| 4,320,507 | 3/1982 | Fukushima et al. | 371/21 |
| 4,835,774 | 5/1989 | Ooshima et al. | 371/25 |
| 4,841,233 | 6/1989 | Yoshida | 371/21.4 |
| 4,868,823 | 9/1989 | White, Jr. et al. | 371/21.4 |
| 4,984,204 | 1/1991 | Sato et al. | 365/189.11 |
| 4,985,864 | 1/1991 | Price | 365/189.06 |
| 5,046,047 | 9/1991 | Cliff et al. | 371/21.4 |
| 5,068,830 | 11/1991 | Plants et al. | 365/190 |
| 5,117,426 | 5/1992 | McAdams | 371/21.4 |
| 5,150,325 | 9/1992 | Yanagisawa et al. | 365/177 |
| 5,173,906 | 12/1992 | Dreibelbis et al. | 371/21.4 |
| 5,185,722 | 2/1993 | Ota et al. | 371/21.1 |
| 5,384,503 | 1/1995 | Shu et al. | 327/52 |

Primary Examiner—Robert W. Beausoliel, Jr.
Assistant Examiner—Dieu-Minh Le
Attorney, Agent, or Firm—Hill, Steadman & Simpson

[57] ABSTRACT

A test circuit for a single chip semiconductor memory array, located in the chip, enables testing of all columns along a word lines without additional column readout circuits. A pair of current detecting differential amplifiers are connected to the bit lines of multiple memory cells along a word line, and the amplifier outputs are compared to generate a pass/fail signal during a read access.

6 Claims, 3 Drawing Sheets

CURRENT MODE TEST CIRCUIT FOR SRAM

This is a continuation of application Ser. No. 07/942/719 filed Sep. 9, 1992, now abandoned.

FIELD OF THE INVENTION

This invention relates to static random access semiconductor memories, and more particularly to apparatus facilitating the testing of same.

BACKGROUND

In order to reduce the manufacturing costs of large scale semiconductor memories, it is desirable to reduce the test time required for testing the memories. Since it is very time consuming to test memories using external circuits only, it has been suggested that internal circuitry be provided on the chip, as part of the memory, for testing memory functionality. Typically, these test circuits operate in a voltage mode, requiring that the analog voltage levels of the memory cell be converted to a CMOS logic level somewhere along the test path. This conversion requires either the use of additional circuits directly connected to the matrix columns or requires that the number of columns tested correspond to the number of sense amplifiers present in the data path. When additional structure is required on the chip, the space available for the matrix of memory cells is decreased. Alternatively, when the number of columns tested is restricted to a few sense amplifiers, a relatively large amount of time is required for testing, because of the limited number of sense amplifiers.

It is therefore desirable to provide a test method which enables the testing of all of the columns of the memory array simultaneously, without the need for adding sense amplifiers.

BRIEF DESCRIPTION OF THE INVENTION

In accordance with the present invention, a test circuit is provided for testing all of the columns along a word line without additional column readout circuits. The technique uses two current detecting differential amplifiers to detect the contents of multiple memory cells along the same word line. The amplifier outputs are then compared and a pass/fail signal is generated.

Because of the relative small overhead required by this testing circuit, very little space is taken away from the area available for memory cells. In addition, testing proceeds rapidly, because all columns are tested at the same time.

BRIEF DESCRIPTION OF THE DRAWINGS

Reference will now be made to the accompanying drawings, in which.

DESCRIPTION OF THE PREFERRED EMBODIMENTS

Figure 1:
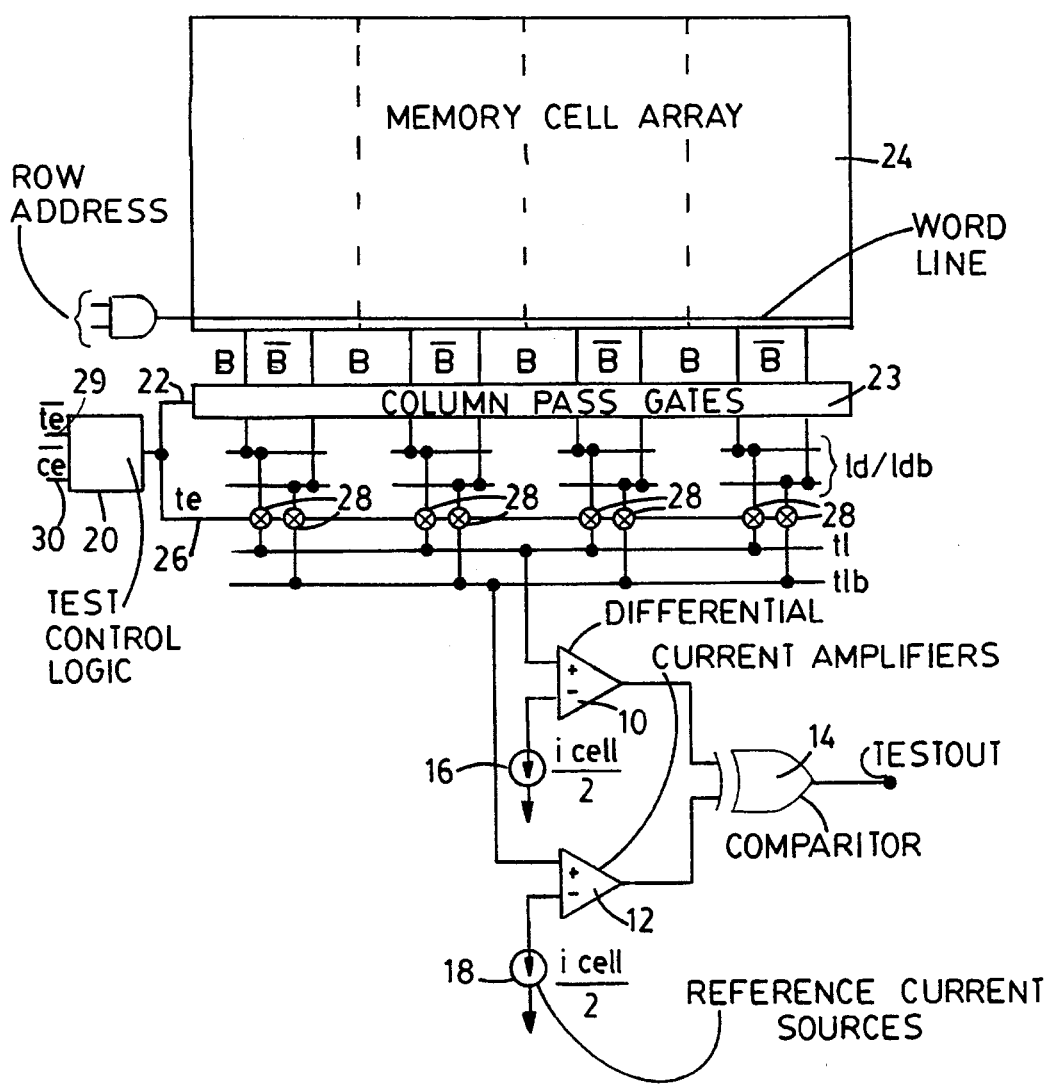
FIG. 1 is a schematic diagram of a test circuit incorporating the present invention, associated with a memory cell array.

Referring now to FIG. 1, the apparatus on a single semiconductor chip is shown, including a memory cell array 24. The cells of the array 24 are connected via column pass gates 23 to a pair of complementary or differential data lines LD and LDB in the conventional manner. Two differential current amplifiers 10 and 12 are provided, each of which produces a voltage output which is connected to separate inputs of a comparator 14, viz., an exclusive OR gate. Two current sources 16 and 18 are provided, each being individually connected to the inverting input of their respective amplifiers 10 and 12. The non-inverting input of the amplifiers are connected to complementary test lines TL and TLB.

Each of the current sources 16 and 18 generate a current equal to ½ of the memory cell current.

A test control logic unit 20 is provided, which provides control signals during the test operation. A first output from the logic unit 20 is connected to inputs of all the column pass gates 23, so that all of the column pass gates are simultaneously enabled in the section of the memory cell array 24 which is under test. Another output 26 from the logic control unit 21 is connected to a plurality of switches 28 which together form a multiplexer, for multiplexing signals for the several local data lines LD and LDB onto the test lines TL and TLB. Two connections are provided from the test logic unit 20 to the output pins of the chip on which the memory cell array is located, and these lead to terminals 29 and 30 identified by $\overline{TC}$ (test control) and $\overline{CE}$ (chip enable). The test control logic is operated when the chip enable line $\overline{CE}$ is low, and a low signal simultaneously occurs at the terminal $\overline{TC}$.

Figure 2:
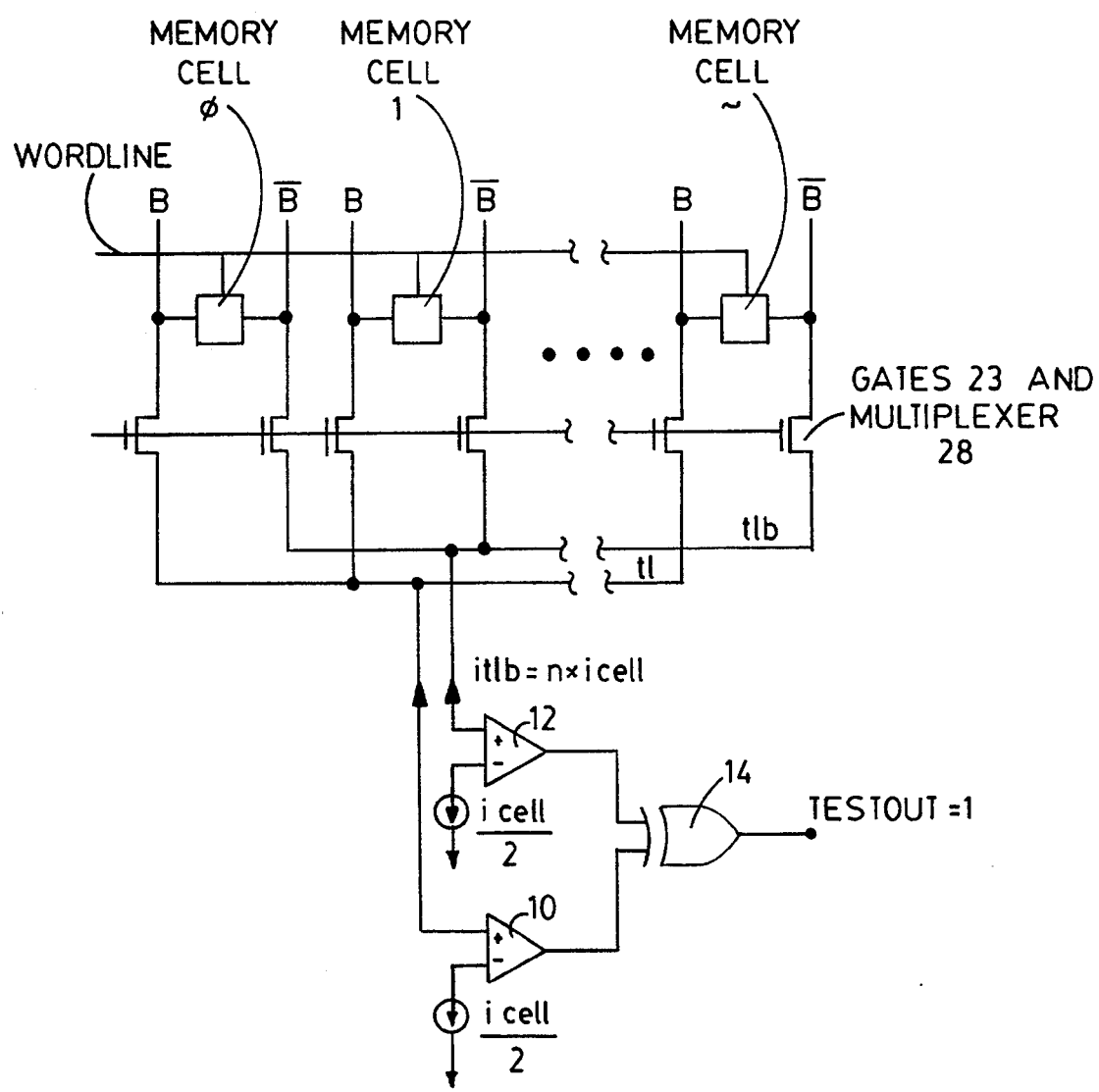
FIG. 2 is a diagram illustrating the operation of the present invention for a case of no memory errors.

FIG. 2 illustrates the system of the present invention with a portion of the memory shown in greater detail, and illustrates operation of the circuit when no memory cell fails. All the memory cells along the word line in the memory array under test are written with the same data, for example logic 1. With the test control signal enabled, the entire row of memory cells is connected to the test line through the column pass gates and test multiplex devices. The contents of the memory cells are then read by the test amplifiers. When all the cells have correctly stored a logic 1, no current flows in the test line TL, and a current equal to the number of memory cells accessed, multiplied by the current drawn by a single memory cell, will flow in the complementary test line TLB. The absence of current flow in the test line TL causes the output of the first differential amplifier 10 to go low, while the presence of current flow in the complementary test line TLB forces the output of the second differential amplifier 12 to go high. The comparator 14 is used to detect the two opposite logic states of the test amplifier logic, and outputs a logic 1 indicating that the proper data is stored by the memory cells. This represents a satisfactory testing of all of the memory cells along a word line.

Figure 3:
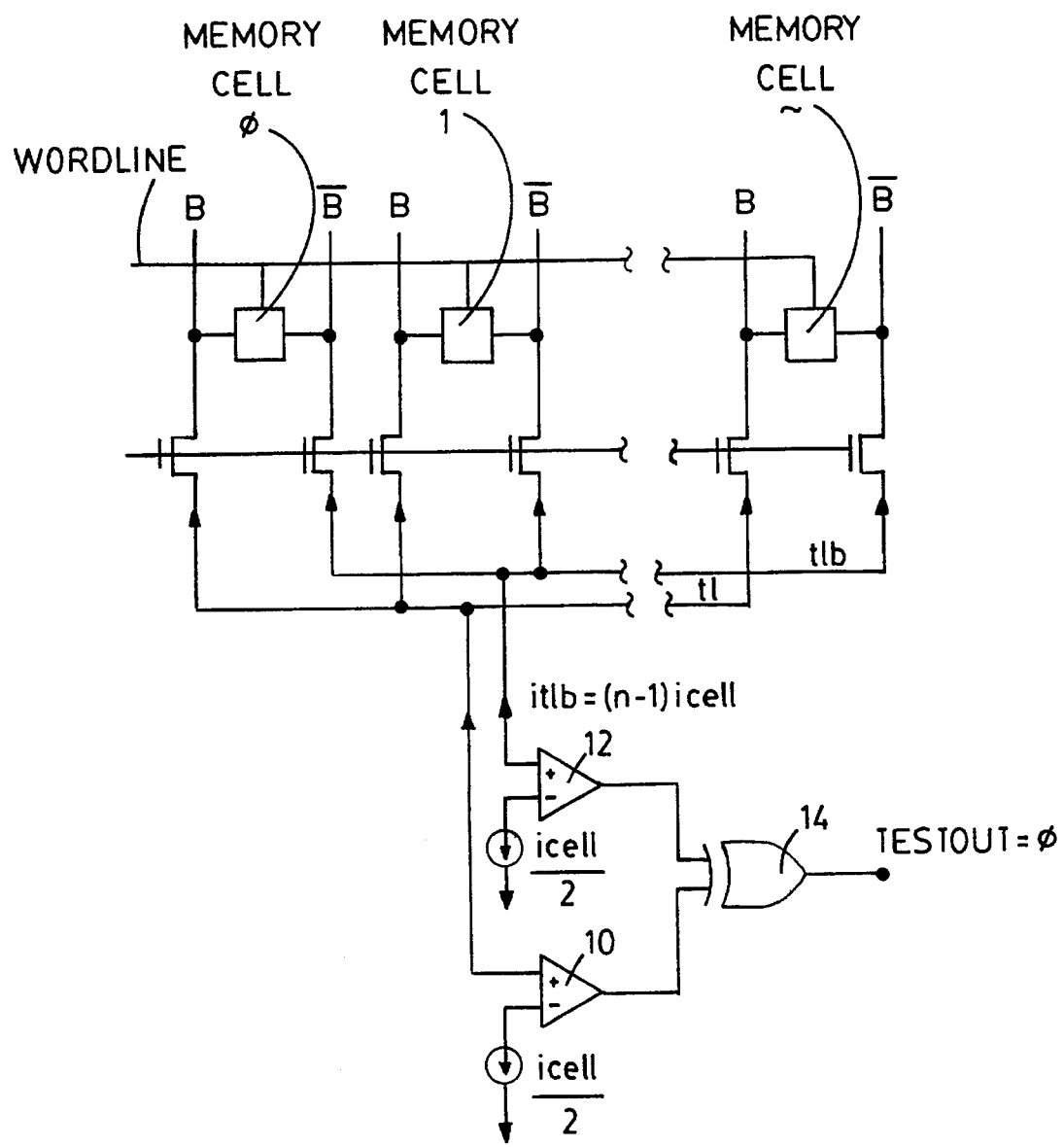
FIG. 3 is a diagram illustrating operation of the present invention for a case in which a memory cell has failed.

FIG. 3 shows a case in which one or more of the memory cells fails to store a logic 1, and thus revert to the opposite data state, namely a logic 0. In this case, a current will flow in both the test line TL and the complementary test line TLB. This causes both test amplifiers 10 and 12 to detect current and output logic 1s, causing the comparator 14 to output a logic 0, indicating that one or more memory cells have failed to properly store the data written to it. The technique thus relies on the fact that if opposite data from that which is written is stored in any memory cell, current will unexpectedly be present in the one of the test lines for which no current is expected. This requires no additional column circuits to detect the contents of the memory cells, and enables simultaneous testing of all of the columns.

It is apparent that various modifications and additions may be made in the apparatus of the present invention without departing from the essential features of novelty thereof, which are intended to be defined and secured by the appended claims.

What is claimed is:

1. A test circuit mounted on a single chip semiconductor memory, said memory consisting of an array of memory cells arranged in rows and columns and adapted for read/write access by row word lines and column bit lines, and column pass gates for connecting bit lines of said memory array to a plurality of local data lines, said test circuit comprising multiplexer means for selectively connecting said local data lines to first and second complementary test lines, a pair of differential current amplifiers, respectively having one input connected to said first and second test lines, and comparator means for comparing signals produced by said differential current amplifiers while a plurality of memory cells is being read and producing a pass/fail signal in response to whether both of said test lines conduct current while said memory cells are being read.

2. The test circuit according to claim 1, wherein said comparator means comprises an exclusive OR gate.

3. The test circuit according to claim 1, including a test control logic circuit connected to said multiplexer means for selectively connecting a plurality of said local data lines to said first and second complementary test lines.

4. The test circuit according to claim 1, including a pair of current sources individually connected to a second input of each of said differential current amplifiers, each of said current sources providing a current flow equal to one-half a nominal current which flows through a memory cell during a reading access, whereby an output of each of said differential current amplifiers assumes one state when current flows from one or more connected memory cells during a reading access, and said output assumes a different state when no current flows from a connected memory cell during said reading access.

5. The test circuit according to claim 1, including a word line for simultaneously selecting a plurality of said memory cells for reading, and a plurality of the selected memory cells are simultaneously tested by simultaneously supplying the outputs thereof to said local data lines.

6. A test circuit mounted on a single chip semiconductor memory, said memory consisting of an array of memory cells arranged in rows and columns and adapted for read-write access by row word lines and column bit lines, and column pass gates for connecting bit lines of said memory array to a plurality of local data lines, said test circuit comprising multiplexer means for selectively connecting said local data lines to first and second complementary test lines, and comparator means for comparing signals on said test lines while a plurality of memory cells is being read, said plurality of memory cells having been written with the same data, said comparator producing a pass signal in response to one of said test lines conducting current and the other of said test lines not conducting current while the plurality of memory cells are being read, signifying that the same data is being read from all of said plurality of memory cells.

* * * * *